United States Patent
Ishibashi et al.

(10) Patent No.: US 8,932,519 B2
(45) Date of Patent: Jan. 13, 2015

(54) SOLDER ALLOY

(75) Inventors: Seiko Ishibashi, Tokyo (JP); Shunsaku Yoshikawa, Tokyo (JP); Tsukasa Ohnishi, Sapporo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 13/261,681

(22) PCT Filed: Apr. 9, 2012

(86) PCT No.: PCT/JP2012/059668
§ 371 (c)(1),
(2), (4) Date: Jun. 27, 2013

(87) PCT Pub. No.: WO2013/153595
PCT Pub. Date: Oct. 17, 2013

(65) Prior Publication Data
US 2013/0343809 A1    Dec. 26, 2013

(51) Int. Cl.
C22C 13/00 (2006.01)
B23K 35/26 (2006.01)
B23K 35/02 (2006.01)
B23K 1/00 (2006.01)
B23K 1/008 (2006.01)
B23K 1/20 (2006.01)
H05K 3/34 (2006.01)

(52) U.S. Cl.
CPC .............. *B23K 35/262* (2013.01); *C22C 13/00* (2013.01); *B23K 35/02* (2013.01); *B23K 35/0222* (2013.01); *B23K 35/0244* (2013.01); *B23K 35/025* (2013.01); *B23K 1/0016* (2013.01); *B23K 1/008* (2013.01); *B23K 1/203* (2013.01); *H05K 3/3463* (2013.01); *B23K 2201/36* (2013.01)
USPC ............................................. 420/561; 403/272

(58) Field of Classification Search
CPC ............................... C22C 13/00; B23K 35/262
See application file for complete search history.

(56) References Cited

U.S. PATENT DOCUMENTS

2005/0100474 A1 *    5/2005    Huang et al. ................... 420/560

FOREIGN PATENT DOCUMENTS

| JP | 2001096394 | 4/2001 |
| JP | 2001504760 | 4/2001 |
| JP | 2002239780 | 8/2002 |
| JP | 2004154845 | 6/2004 |
| JP | 2005040847 | 2/2005 |
| JP | 2007237251 | 9/2007 |
| JP | 2009506203 | 2/2009 |
| WO | 2006129713 | 12/2006 |
| WO | WO 2007023288 A2 * | 3/2007 |

OTHER PUBLICATIONS

Masamoto et al., Machine transation of JP2002-239780 A. 2002.*

* cited by examiner

*Primary Examiner* — Roy King
*Assistant Examiner* — Xiaowei Su
(74) *Attorney, Agent, or Firm* — Michael Tobias

(57) ABSTRACT

A Sn—Ag—Cu based solder alloy capable of increasing the connection reliability of a solder joint when evaluated in a high temperature environment is provided. The alloy has an alloy composition consisting essentially of, in mass percent, Ag: 1.0-5.0%, Cu: 0.1-1.0%, Sb: 0.005-0.025%, Fe: 0.005-0.015%, and a remainder of Sn. The Fe content in mass percent is 0.006-0.014%. The Sb content in mass percent is 0.007-0.023%. Preferably Fe:Sb as a mass ratio is 20:80-60:40. The total content of Fe and Sb is preferably 0.012-0.032%.

6 Claims, 4 Drawing Sheets

SOLDER ALLOY

TECHNICAL FIELD

This invention relates to a Sn—Ag—Cu based solder alloy and particularly to a Sn—Ag—Cu based solder alloy which can provide solder connections (solder joints) with connection reliability even when used for long periods at a high temperature.

BACKGROUND ART

Sn—Ag—Cu solder alloys have been widely used as lead-free solders. The range of application of lead-free solder alloys is continuing to expand. As the use of the alloys has expanded, a desire has developed to use them in more severe environments. At the same time, a desire has also developed for high connection reliability such that a solder joint does not fracture or deteriorate even if used for long periods in such environments.

The environments of use of solder joints envisioned in this description are, for example, environments in which mobile phones, vehicle-mounted electronic parts, or the like are used. Evaluation of connection reliability is carried out by an accelerated test in a high temperature environment at a temperature of 125° C. or 150° C. for 500 hours or 1000 hours.

With the object of further improving conventional Sn—Ag—Cu solder alloys, it has been proposed to improve their connection reliability, resistance to drop impact, and wettability by adding Ni, Fe, or the like. Patent Documents 1-4 are representative examples of such proposals.

In recent years, because such solder alloys have been used for solder joints of printed circuit boards or packages for mobile phones or the like, there is a demand for a high degree of temperature cycle properties and connection reliability in high temperature environments. In order to cope with these demands, Patent Document 5 investigates a solder alloy containing P, Bi, or Sb in a Sn—Ag—Cu solder alloy. Patent Document 6 investigates a solder alloy containing Sb or Fe in a Sn—Ag—Cu solder alloy.

PRIOR ART DOCUMENTS

Patent Documents

Patent Document 1: JP 2005-040847 A
Patent Document 2: JP 2001-504760 B
Patent Document 3: JP 2007-237251 A
Patent Document 4: JP 2001-096394 A
Patent Document 5: JP 2004-154845 A
Patent Document 6: JP 2002-239780 A

SUMMARY OF THE INVENTION

Although the solder alloys disclosed in Patent Documents 1-4 improve impact resistance and spreadability by the addition of Ni, Fe, or the like, it is necessary for them to guarantee high connection reliability under more severe environments.

The solder alloy disclosed in Patent Document 5 exhibits the effect of suppressing the growth of intermetallic compounds formed in a bonding interface of a solder joint in a high temperature environment, thereby decreasing the number of occurrences of Kirkendall voids. However, if only P, only Bi, or only Sb is added to a Sn—Ag—Cu alloy, the effect is still inadequate and further improvements are necessary.

Patent Document 6 states that the alloy disclosed therein has excellent resistance to thermal fatigue due to its excellent ductility and strength. However, the compositions which are actually investigated in Patent Document 6 are only compositions containing either at least 0.3 mass % of Sb or 0.2 mass % of Fe. There is no disclosure in Patent Document 6 of a composition containing both of these elements, and there is also no description of the results of a high temperature exposure test or the like. Therefore, it has not been established whether a composition containing only one of Sb and Fe or a composition containing both of these elements can withstand an accelerated test as described above.

The object of the present invention is to provide a Sn—Ag—Cu based solder alloy which provides a solder joint having an increased connection reliability when evaluated in a high temperature environment.

The present inventors knew that the formation of Kirkendall voids during use in a high temperature environment presents a problem in guaranteeing connection reliability of a Sn—Ag—Cu based solder alloy. Accordingly, a specific object of the present invention is to provide a Sn—Ag—Cu based solder alloy which can effectively prevent the formation of such Kirkendall voids.

Means for Solving the Problem

As a result of further investigations, the present inventors found that by suppressing the formation of $Cu_3Sn$ intermetallic compounds in the bonding interface of solder joints, the number of occurrences of Kirkendall voids can be reduced even during use in a high temperature environment. Furthermore, the present inventors found that by adding a minute amount of Fe and Sb to a Sn—Ag—Cu solder alloy in order to decrease the number of occurrences of Kirkendall voids which develop, due to a synergistic effect of these elements, the formation of the above-described intermetallic compounds in the bonding interface of a solder joint can be effectively prevented, and connection reliability is enormously improved.

The present invention is as follows.

(1) A solder alloy having an alloy composition consisting essentially of, in mass percent, Ag: 1.0-5.0%, Cu: 0.1-1.0%, Sb: 0.005-0.025%, Fe: 0.005-0.015%, and a reminder of Sn.

(2) A solder alloy as set forth above in (1) wherein the Ag content in mass percent is 2.0-4.0%.

(3) A solder alloy as set forth above in (1) or (2) wherein the Cu content in mass percent is 0.2-0.7%.

(4) A solder alloy as set forth above in any one of (1)-(3) wherein the Sb content in mass percent is 0.007-0.023%.

(5) A solder alloy as set forth above in any one of (1)-(4) wherein Fe:Sb as a mass ratio is from 20:80 to 60:40.

(6) A solder alloy as set forth above in any one of (1)-(5) wherein the Fe content in mass percent is 0.006-0.014%.

(7) A solder ball made from a solder alloy as set forth above in any one of (1)-(6).

(8) A solder joint made from a solder alloy as set forth above in any one of (1)-(6).

(9) A bonding method using a solder alloy as set forth above in any one of (1)-(6).

MODES FOR CARRYING OUT THE INVENTION

Figure 1:
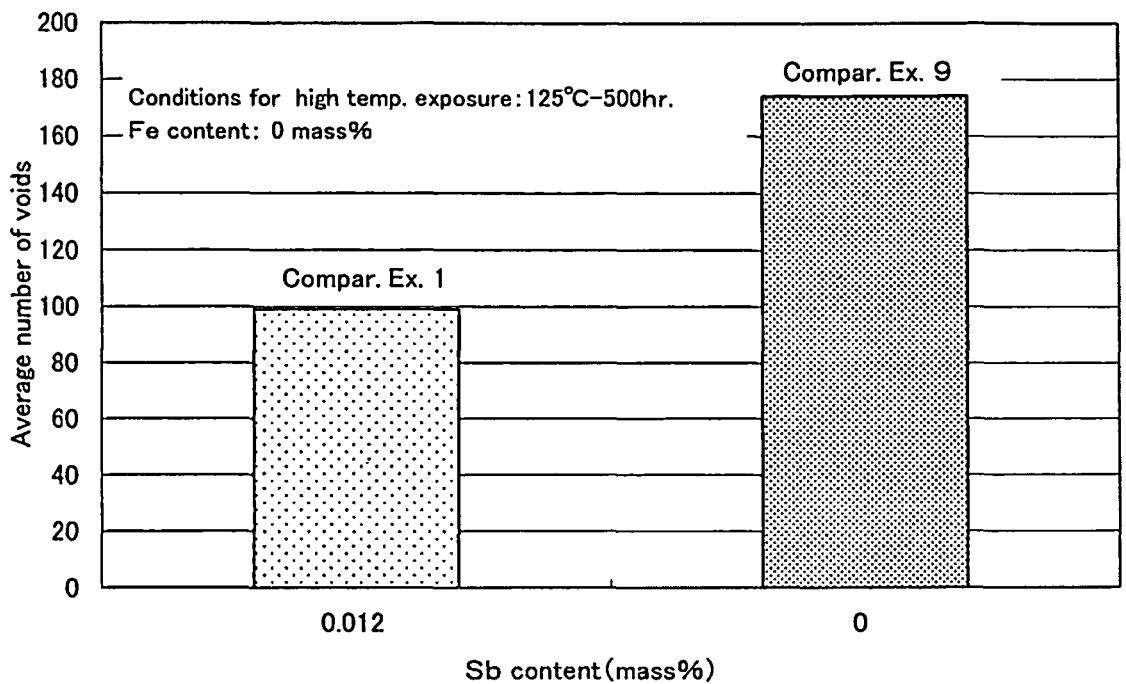
FIG. 1 is a graph showing the relationship between the average number of occurrences of voids and the Sb content.

The present invention will be explained below in greater detail. In this description, percent with respect to a solder alloy composition means mass percent unless otherwise indicated.

A Sn—Ag—Cu—Sb—Fe solder alloy according to the present invention contains both Sb and Fe. Therefore, even when it is exposed to a high temperature environment for a prolonged period, it is possible to guarantee excellent connection reliability because growth of intermetallic compounds such as $Cu_3Sn$ which are formed in the bonding interface with electrodes is suppressed, leading to a reduction in the number of occurrences of Kirkendall voids.

It is conjectured that Kirkendall voids develop by the following mechanism. When a solder alloy is connected to a Cu electrode, for example, intermetallic compounds such as $Cu_3Sn$ are formed in the bonding interface. During exposure for long periods to a high temperature environment, the $Cu_3Sn$ grows, and due to the difference in the diffusion coefficients between Sn and Cu, an imbalance in their mutual diffusion develops. As a result of this imbalance, lattice vacancies develop in the crystal lattice. Due to the lattice vacancies accumulating without being eliminated, so-called Kirkendall voids (sometimes referred to below as voids) develop.

The alloy composition of a solder alloy according to the present invention is as follows.

The Ag content is 1.0-5.0%. Ag increases the strength of a solder alloy. If the Ag content is greater than 5.0%, a large amount of $Ag_3Sn$ develops in the solder alloy, thereby embrittling the solder alloy, and its resistance to drop impact deteriorates. If the Ag content is less than 1.0%, the strength of the solder alloy is not sufficient. The Ag content is preferably 2.0-4.0% and more preferably 2.9-3.1%.

The Cu content is 0.1-1.0%. Cu increases the strength of a solder alloy. If the Cu content is less than 0.1%, the effect of increasing the mechanical strength of a solder alloy is not sufficient. If the Cu content is greater than 1.0%, the liquidus temperature of the solder alloy increases, leading to a decrease in wettability, formation of dross when the solder alloy melts, and an increase in the number of occurrences of voids. As a result, connection reliability decreases. The Cu content is preferably 0.2-0.7% and more preferably 0.45-0.55%.

An alloy composition which adds only Sb or Fe to a Sn—Ag—Cu based solder alloy is insufficient to decrease the number of occurrences of Kirkendall voids. Therefore, an alloy composition containing both of Fe and Sb is used.

The Sb content is 0.005-0.025%. Sb suppresses the growth of $Cu_3Sn$ intermetallic compounds and decreases the number of voids which are formed. In addition, adding Sb together with Fe to a Sn—Ag—Cu solder alloy is important in suppressing an increase in the number of voids which develop. If the Sb content is less than 0.005%, the number of voids which are formed cannot be suppressed, so excellent connection reliability cannot be obtained. If the Sb content is greater than 0.025%, it is not possible to further improve the effect of suppressing the number of voids which are formed. The Sb content is preferably 0.007-0.023% and more preferably 0.01-0.02%.

The Fe content is 0.005-0.015%. In the same manner as Sb, Fe suppresses mutual diffusion between Cu, which is an electrode material, and Sn, thereby suppressing the growth of $Cu_3Sn$ intermetallic compounds and decreasing the number of voids which are formed. If the Fe content is less than 0.005%, it cannot suppress the growth of $Cu_3Sn$ intermetallic compounds, and due to the formation of a large number of voids, it is not possible to obtain excellent connection reliability. If the Fe content is larger than 0.015%, oxides of Fe are formed in the solder alloy and wettability worsens. In addition, it becomes difficult to work a solder alloy so as to form desired solder balls, for example. The Fe content is preferably 0.006-0.014% and more preferably 0.007-0.013%.

Thus, a solder alloy according to the present invention can achieve excellent connection reliability by adding both Fe and Sb to a Sn—Ag—Cu solder alloy. This is thought to be because strong $FeSb_2$ or similar compounds are formed at the grain boundaries of $Cu_3Sn$ which most easily undergoes atomic diffusion, thereby suppressing the growth of $Cu_3Sn$ by diffusion of Cu, as a result of which the number of voids which are formed can be decreased.

From this standpoint, the ratio of the contents of Fe and Sb as a mass ratio is preferably Fe:Sb=20:80-60:40, more preferably Fe:Sb=40:60-60:40, and particularly preferably Fe:Sb=40:60-50:50. From the same standpoint, the overall mass of Fe and Sb is preferably 0.012-0.032%, more preferably 0.015-0.025%, and particularly preferably 0.017-0.025%.

A solder alloy according to the present invention sometimes contains Pb as an impurity. The content of Pb as an impurity is at most 0.01%.

In the present invention, the conditions for high temperature exposure in an accelerated test are a temperature of 125° C. or 150° C. and a duration (length of time) of 500 or 1000 hours. These conditions are sufficient even when the solder alloy is used in mobile phones or automotive parts requiring high connection reliability.

A solder alloy according to the present invention can be used as a solder ball (solder sphere). A solder ball according to the present invention is a sphere of solder typically having a diameter of 0.01-1.0 mm which is used to form electrodes of semiconductor packages such as BGAs (ball grid arrays) or to form bumps on substrates (circuit boards). Solder balls can be manufactured by usual manufacturing methods for solder balls.

A solder alloy according to the present invention can also be used in the form of a solder paste. A solder paste is formed by mixing a solder powder with a small amount of a flux to form a paste. Solder paste is widely used for mounting electronic parts on printed circuit boards by the reflow soldering method. A flux used in solder paste can be either a water soluble flux or a non-water soluble flux, but typically a rosin flux which is a rosin based non-water soluble flux is used. A solder alloy according to the present invention can also be used in the form of a preform, a wire, or the like.

A bonding method using a solder alloy according to the present invention can be carried out in accordance with usual procedures by the reflow method, and use of a solder alloy according to the present invention does not require special conditions. Specifically, soldering is generally carried out at a temperature from a few degrees to 20° C. higher than the solidus temperature of the solder alloy, and the peak temperature is made 240° C., for example.

A solder joint according to the present invention connects the electrodes of a package (PKG) of an IC chip or the like to the electrodes of a substrate such as a printed circuit board (PCB) using a solder alloy according to the present invention. Namely, a solder joint according to the present invention refers to a connecting portion between such an electrode and solder. A solder joint according to the present invention can be formed using typical soldering conditions.

A solder alloy according to the present invention exhibits its effects in severe environments of use like those described above, but it may be of course used in a conventional environment of use.

EXAMPLES

Solder balls having a diameter of 0.3 mm were prepared from the solder alloys shown in Table 1. A water soluble flux (WF-6400 manufactured by Senju Metal Industry Company, Ltd.) was printed to a thickness of 100 μm on Cu electrodes which were disposed in a prescribed pattern on a printed circuit board and which had undergone surface treatment with a preflux (OSP=organic solderability preservative). After the solder balls which were previously prepared were mounted on the Cu electrodes, soldering was carried out by the reflow method to obtain samples having solder joints formed thereon. Using these samples, the following tests were carried out and the number of voids which developed was measured.

1) High Temperature Exposure Test

The samples were held in a thermostat (in air) set at 125° C. for 500 hours, 125° C. for 1000 hours, 150° C. for 500 hours, or 150° C. for 1000 hours. The samples were then removed from the thermostat and cooled.

2) Calculation of the Number of Voids

After the high temperature exposure test, a cross-sectional photograph of a solder joint of the samples subjected to each condition was taken using an FE-SEM at a magnification of 3000×. For each sample, the total number of voids having a diameter of at least 0.1 μm which formed in the solder joint interface was counted, and the average number of voids which were formed was calculated. The results are shown in Table 1. Cases in which the average number of voids which developed was at most 60 were evaluated as good (○), those having 61-99 voids were evaluated as fair (Δ), and those having 100 or more voids were evaluated as poor (×). In Table 1, underlining indicates a composition outside the range of the present invention.

TABLE 1

| | Solder alloy composition (%) | | | | | High temperature exposure | | Average number | Evaluation of void |
| --- | --- | --- | --- | --- | --- | --- | --- | --- | --- |
| | Sn | Ag | Cu | Fe | Sb | Temp. (° C.) | Period (hr) | of voids | formation |
| Example 1 | bal. | 3.0 | 0.5 | 0.008 | 0.012 | 125 | 500 | 41.5 | ○ |
| Example 2 | bal. | 3.0 | 0.5 | 0.008 | 0.012 | 125 | 1000 | 56.5 | ○ |
| Example 3 | bal. | 3.0 | 0.5 | 0.008 | 0.012 | 150 | 500 | 60 | ○ |
| Example 4 | bal. | 3.0 | 0.5 | 0.008 | 0.012 | 150 | 1000 | 54 | ○ |
| Example 5 | bal. | 3.0 | 0.5 | 0.012 | 0.013 | 125 | 500 | 40.5 | ○ |
| Example 6 | bal. | 3.0 | 0.5 | 0.012 | 0.013 | 125 | 1000 | 50 | ○ |
| Example 7 | bal. | 3.0 | 0.5 | 0.012 | 0.013 | 150 | 500 | 56.5 | ○ |
| Example 8 | bal. | 3.0 | 0.5 | 0.012 | 0.013 | 150 | 1000 | 42 | ○ |
| Example 9 | bal. | 1.0 | 0.5 | 0.007 | 0.005 | 125 | 500 | 53.5 | ○ |
| Example 10 | bal. | 1.0 | 0.5 | 0.007 | 0.005 | 125 | 1000 | 53.5 | ○ |
| Example 11 | bal. | 1.0 | 0.7 | 0.008 | 0.005 | 125 | 500 | 44 | ○ |
| Example 12 | bal. | 1.0 | 0.7 | 0.008 | 0.005 | 125 | 1000 | 41 | ○ |
| Compar. 1 | bal. | 3.0 | 0.5 | <u>0</u> | 0.012 | 125 | 500 | 99 | Δ |
| Compar. 2 | bal. | 3.0 | 0.5 | <u>0</u> | 0.012 | 125 | 1000 | 76.5 | Δ |
| Compar. 3 | bal. | 3.0 | 0.5 | <u>0</u> | 0.012 | 150 | 500 | 83 | Δ |
| Compar. 4 | bal. | 3.0 | 0.5 | <u>0</u> | 0.012 | 150 | 1000 | 74.5 | Δ |
| Compar. 5 | bal. | 3.0 | 0.5 | <u>0.002</u> | 0.011 | 125 | 500 | 62.5 | Δ |
| Compar. 6 | bal. | 3.0 | 0.5 | <u>0.002</u> | 0.011 | 125 | 1000 | 64 | Δ |
| Compar. 7 | bal. | 3.0 | 0.5 | <u>0.002</u> | 0.011 | 150 | 500 | 78 | Δ |
| Compar. 8 | bal. | 3.0 | 0.5 | <u>0.002</u> | 0.011 | 150 | 1000 | 62 | Δ |
| Compar. 9 | bal. | 3.0 | 0.5 | <u>0</u> | <u>0</u> | 125 | 500 | 174 | × |
| Compar. 10 | bal. | 3.0 | 0.5 | 0.0088 | <u>0.0002</u> | 125 | 500 | 134.5 | × |
| Compar. 11 | bal. | 3.0 | 0.5 | 0.011 | <u>0.0001</u> | 125 | 500 | 108 | × |
| Compar. 12 | bal. | 3.0 | 0.5 | <u>0.027</u> | 0.005 | 125 | 500 | 94 | Δ |
| Compar. 13 | bal. | 3.0 | 0.5 | <u>0.03</u> | 0.001 | 125 | 500 | 107 | × |
| Compar. 14 | bal. | 3.0 | 0.5 | <u>0.04</u> | <u>0.0001</u> | 125 | 500 | 118.5 | × |
| Compar. 15 | bal. | 3.0 | 0.5 | <u>0.055</u> | <u>0.0002</u> | 125 | 500 | 104.5 | × |

Compar. = Comparative Example

As shown in Table 1, in Examples 1-12, the number of voids which developed in each of the high temperature exposure conditions was at most 60, indicating that the formation of voids could be suppressed. In contrast, in Comparative Examples 1-8 and 12 in which the Fe content was outside the range of the present invention, Comparative Examples 10 and 11 in which the Sb content was outside the range of the present invention, and Comparative Examples 9 and 13-15 in which the Fe and Sb content were both outside the range of the present invention, the number of voids which developed exceeded 60, and a good evaluation was not obtained.

FIG. 1 is a graph showing the relationship between the average number of voids which developed and the Sb content. In FIG. 1, in order to clarify the effect of the addition of just Sb, the results for Comparative Examples 1 and 9 in which the Fe content was 0% were used. In FIG. 1, a Sn—Ag—Cu based solder alloy containing Sb could reduce the average number of voids which developed. However, if only Sb was added, the average number of voids which developed was a high number of around 100, so the formation of voids could not be adequately decreased.

Figure 2:
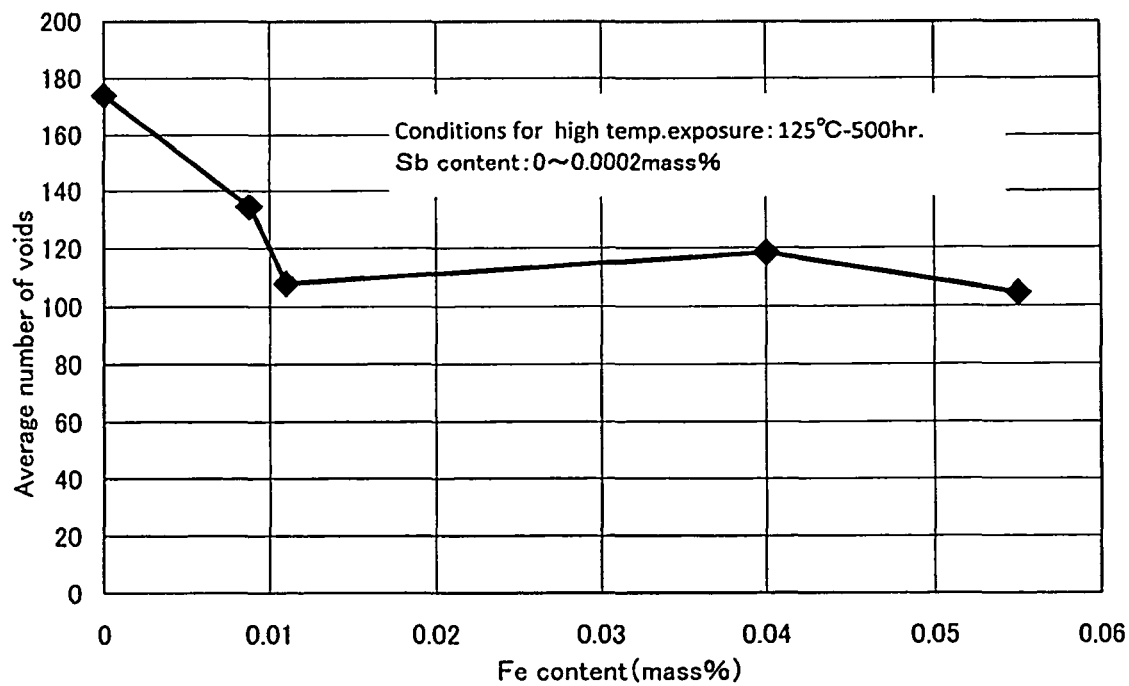
FIG. 2 is a graph showing the relationship between the average number of occurrences of voids and the Fe content when the conditions for high temperature exposure were 125° C. for 500 hours.

FIG. 2 is a graph showing the relationship between the average number of voids which developed and the Fe content when the high temperature exposure conditions were 125° C. for 500 hours. In FIG. 2, in order to clarify the effect of the addition of just Fe, the results of Comparative Examples 9-11, 14, and 15 which had an Sb content of nearly 0% were used.

FIG. 2 shows that a Sn—Ag—Cu based solder alloy containing only Fe can decrease the average number of voids which are formed to a certain extent. However, even if the Fe content was made greater than 0.01%, the number of voids which developed did not further decrease, and the number of voids was a high value of around 100. Therefore, when only Fe was added to a Sn—Ag—Cu alloy, the formation of voids could not be sufficiently decreased.

Figure 3:
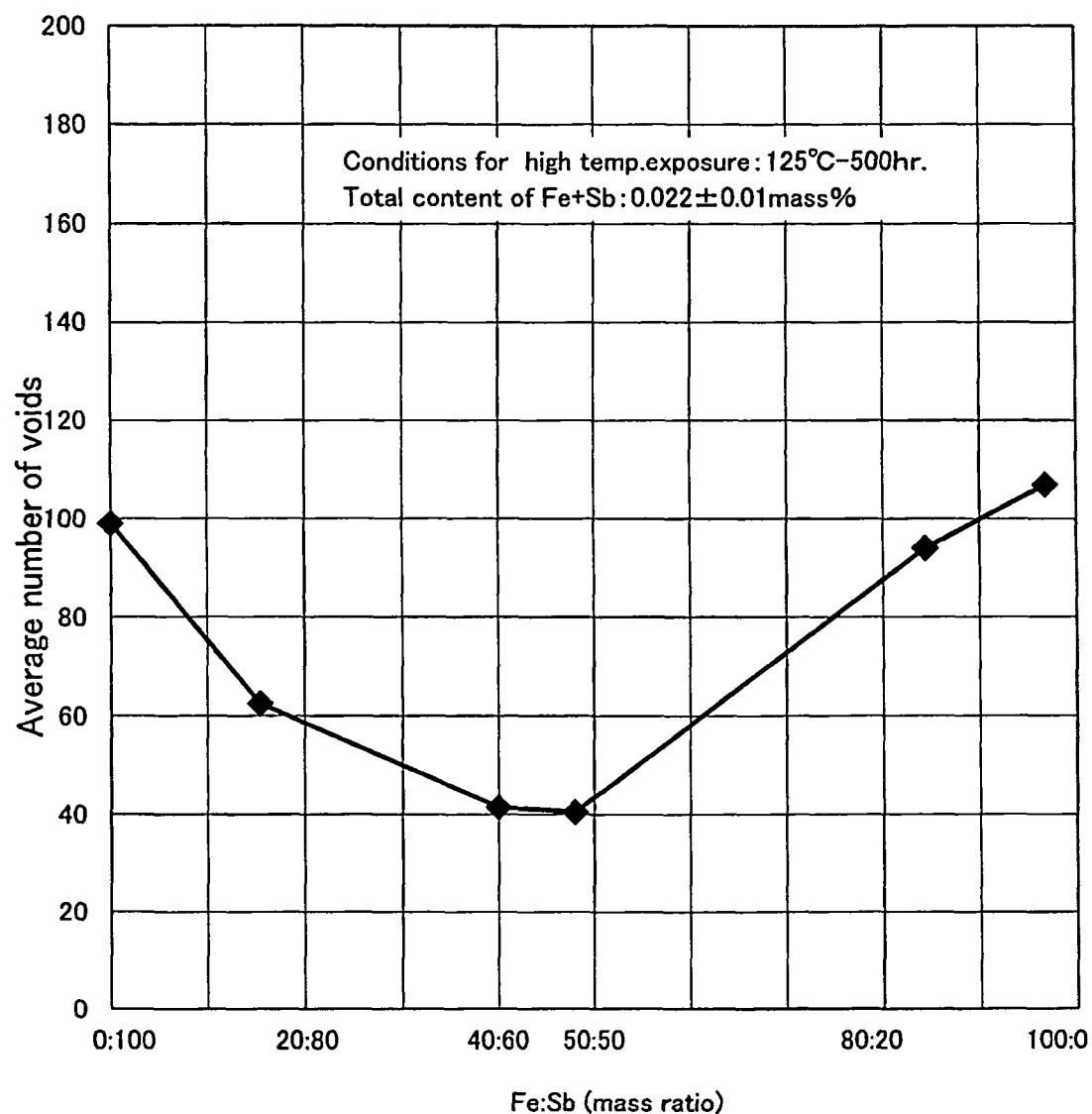
FIG. 3 is a graph showing the relationship between the average number of occurrences of voids and the value of Fe:Sb when the conditions for high temperature exposure were 125° C. for 500 hours.

FIG. 3 is a graph showing the relationship between the average number of voids which developed and the Fe:Sb ratio when the high temperature exposure conditions were 125° C. for 500 hours. In FIG. 3, the results for Examples 1 and 5 and Comparative Examples 1, 5, 12, and 13 for which the total of Fe and Sb was in the range of 0.022±0.01% were used. The Fe content, the Sb content, the Fe:Sb ratio, and the average number of voids which developed are shown in Table 2 for each example. FIG. 3 and Table 2 show that the average number of voids which developed is decreased by the addition of both Fe and Sb in prescribed amounts.

TABLE 2

| Example | Fe (mass %) | Sb (mass %) | Fe:Sb (mass ratio) | Average number of voids | Evaluation of void formation |
|---|---|---|---|---|---|
| Compar. 1 | 0 | 0.012 | 0:100 | 99 | Δ |
| Compar. 5 | 0.002 | 0.011 | 15:85 | 62.5 | Δ |
| Example 1 | 0.008 | 0.012 | 40:60 | 41.5 | ○ |
| Example 5 | 0.012 | 0.013 | 48:52 | 40.5 | ○ |
| Compar. 12 | 0.027 | 0.005 | 80:20 | 94 | Δ |
| Compar. 13 | 0.03 | 0.001 | 96:4 | 107 | x |

Conditions for high temperature exposure: 125° C. for 500 hours
Total content of Fe + Sb: 0.022 ± 0.01 mass %

Figure 4:
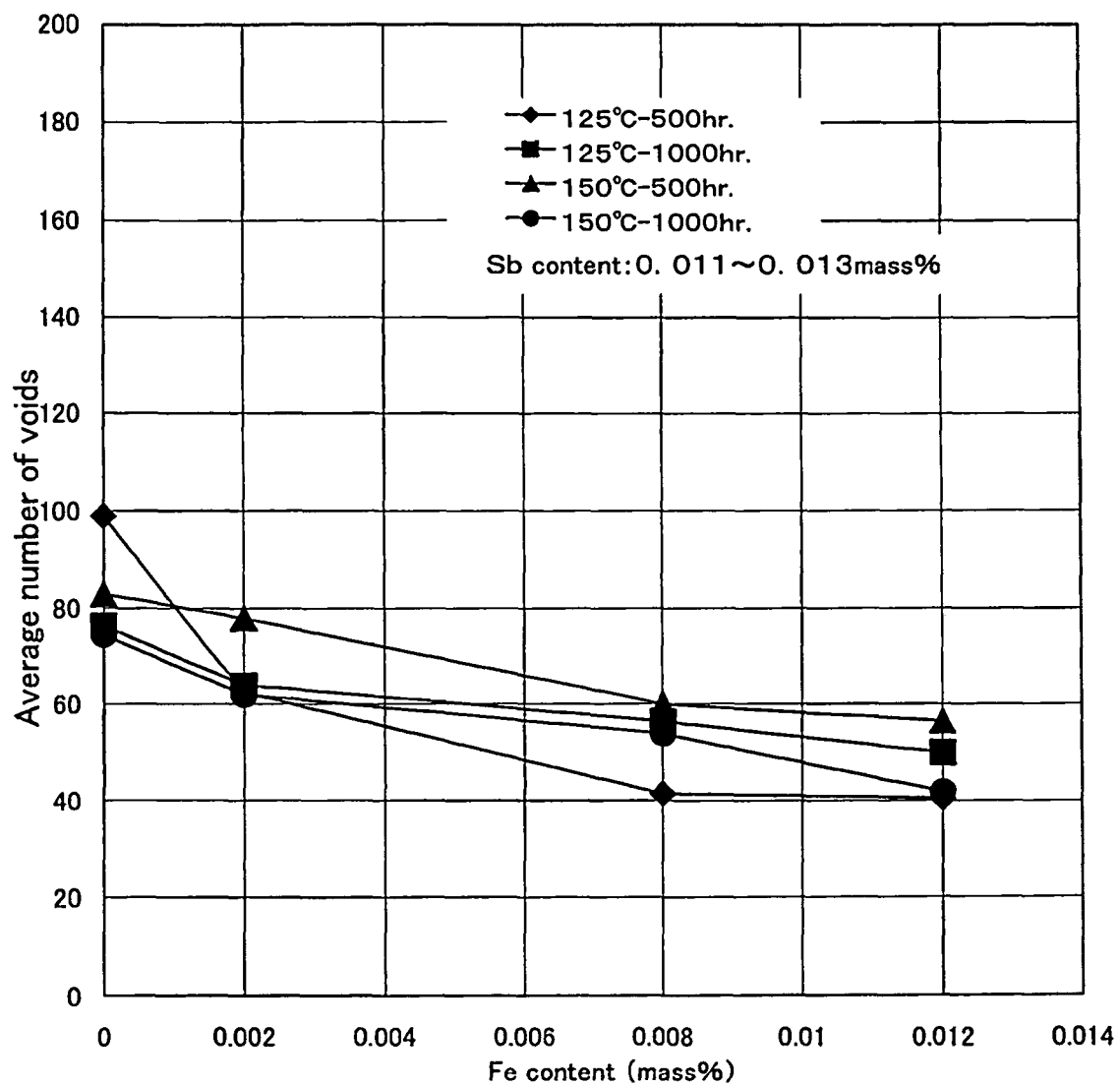
FIG. 4 is a graph showing the relationship between the average number of occurrences of voids and the Fe content for a solder alloy having a prescribed Sb content under different high temperature exposure conditions.

FIG. 4 is a graph showing the relationship between the average number of voids which developed and the Fe content for a solder alloy having a prescribed level of Sb content for each high temperature exposure condition. In FIG. 4, Examples 1-8 and Comparative Examples 1-8 for which the Ag content was 3.0%, the Cu content was 0.5%, the Sb content was 0.011-0.013%, and the remainder was Sn were used. FIG. 4 shows that when the Fe content was in the range of 0-0.012%, the average number of voids which developed decreased under any high temperature exposure conditions when the Fe content was at least 0.005% and particularly at least 0.008%.

FIGS. 5(a)-5(d) are cross-sectional SEM photographs (3000x) of the bonding interface of a solder joint between an electrode and a solder connection immediately after soldering, and FIGS. 5(e)-5(h) are cross-sectional SEM is photographs (3000x) of the bonding interface of a solder joint between an electrode and a solder connection after high temperature exposure at 125° C. for 500 hours. FIG. 5(a) is a cross-sectional SEM photograph of the state before a high temperature exposure test for Comparative Example 1 (Fe: 0%, Sb: 0.012%), FIG. 5(b) is for Comparative Example 5 (Fe: 0.002%, Sb: 0.011%), FIG. 5(c) is for Example 1 (Fe: 0.008%, Sb: 0.012%), and FIG. 5(d) is for Example 5 (Fe: 0.012%, Sb: 0.013%). FIG. 5(e) is a cross-sectional SEM photograph of a solder alloy for Comparative Example 1 (Fe: 0%, Sb: 0.012%), FIG. 5(f) is for Comparative Example 5 (Fe: 0.002%, Sb: 0.011%), FIG. 5(g) is for Example 1 (Fe: 0.008%, Sb: 0.012%), and FIG. 5(h) is for Example 5 (Fe: 0.012%, Sb: 0.013%).

Figure 5:
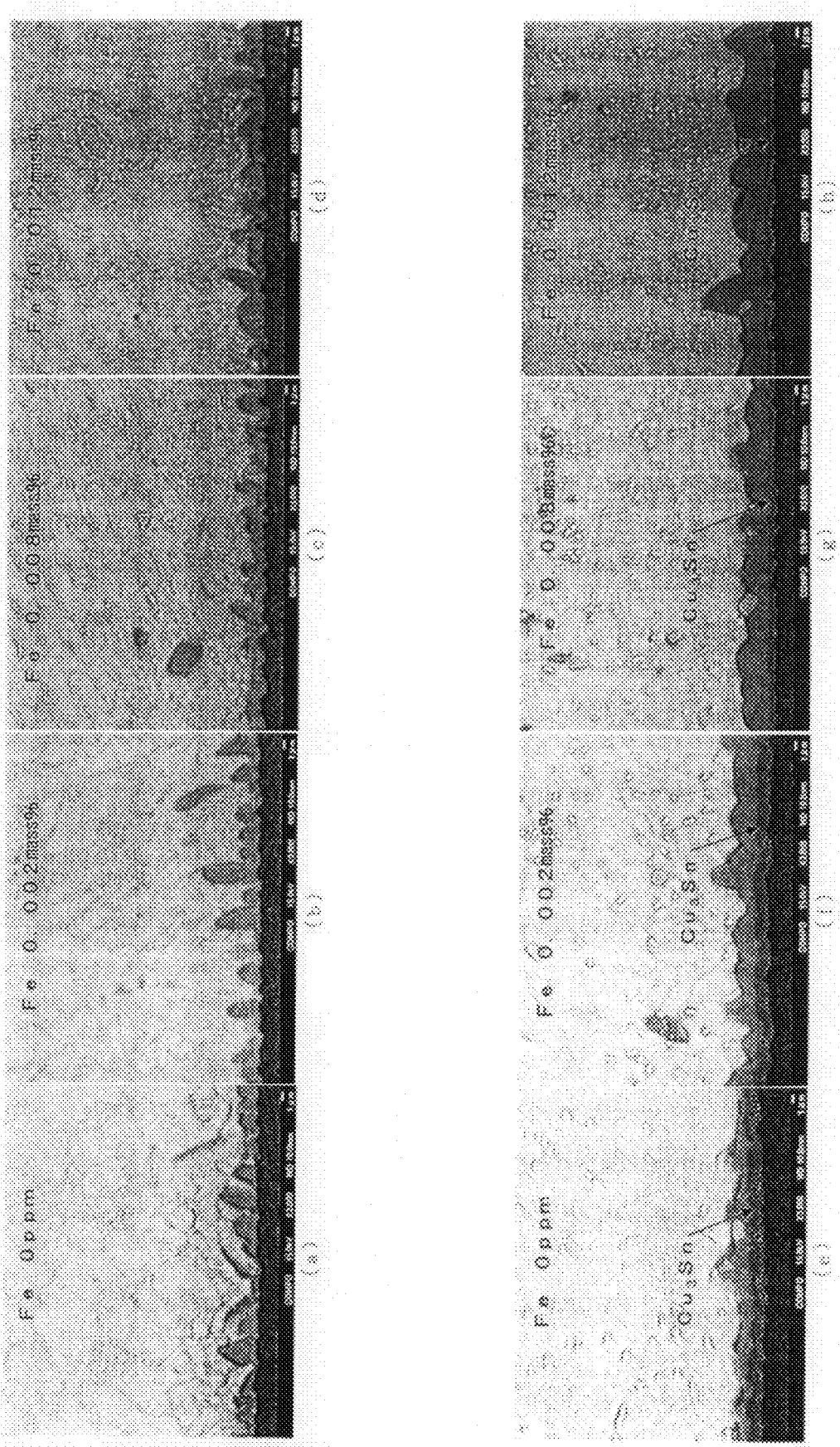
FIGS. 5(a)-5(d) are cross-sectional SEM photographs (3000×) of the bonding interface of a solder joint between an electrode and a solder connection immediately after soldering.
FIGS. 5(e)-5(h) are cross-sectional SEM photographs (3000×) of the bonding interface of a solder joint between an electrode and a solder connection after high temperature exposure at 125° C. for 500 hours.

From FIG. 5 including FIGS. 5(a) to 5(h), it was found that a $Cu_3Sn$ layer grows as a result of high temperature exposure. In addition, it was also found that as the Fe content increases, the growth of a $Cu_3Sn$ layer is suppressed. In the same manner as in FIG. 5, it was ascertained that the growth of a $Cu_3Sn$ layer is suppressed as the Fe content increases when the high temperature exposure conditions are 125° C. for 1000 hours, 150° C. for 500 hours, and 150° C. for 1000 hours.

The average thickness of the $Cu_3Sn$ layer for each high temperature exposure condition was as shown in Table 3.

TABLE 3

| | Conditions for high temperature exposure | | | |
|---|---|---|---|---|
| Fe content (mass %) | 125° C. for 500 hr | 150° C. for 500 hr | 125° C. for 1000 hr | 150° C. for 1000 hr |
| 0 | 1.23 | 1.98 | 1.73 | 2.95 |
| 0.002 | 1.25 | 1.93 | 1.68 | 3.38 |
| 0.008 | 0.73 | 1.18 | 0.90 | 1.78 |
| 0.012 | 0.80 | 1.48 | 1.28 | 2.20 |

Thickness of a $Cu_3Sn$ layer in μm

Table 3 shows that when the Fe content is in the range of 0-0.012%, the growth of a $Cu_3Sn$ layer is suppressed when the Fe content is preferably at least 0.008%. From FIG. 4, FIG. 5, and Table 3, it is clear that the number of voids which develop increases with growth of a $Cu_3Sn$ layer.

From the above, it is clear that in the present invention, because both Fe and Sb are added to a Sn—Ag—Cu solder alloy, the growth of intermetallic compounds such as $Cu_3Sn$ is suppressed and the formation of voids is suppressed.

The invention claimed is:

1. A solder alloy consisting of, in mass percent, Ag: 2.9-3.1%, Cu: 0.1-1.0%, Sb: 0.012-0.013%, Fe: 0.008-0.012%, and a remainder of Sn, wherein in a high temperature exposure test in which solder balls with a diameter of 0.3 mm which are made from the solder alloy are soldered to Cu electrodes on a printed circuit board by reflow soldering to form solder joints and are then held in air at 125° C. for 500 hours, the average number of Kirkendall voids having a diameter of at least 0.1 μm in the solder joints is at most 60.

2. A solder alloy as claimed in claim 1 containing 0.2-0.7 mass % of Cu.

3. A solder ball made from a solder alloy as claimed in claim 1.

4. A solder joint made from a solder alloy as claimed in claim 1.

5. A bonding method comprising soldering two members to each other using a solder alloy as claimed in claim 1.

6. A solder alloy as claimed in claim 1 containing 0.45-0.55 mass % of Cu.

\* \* \* \* \*